United States Patent
Chang et al.

(10) Patent No.: US 7,310,005 B2
(45) Date of Patent: Dec. 18, 2007

(54) RECEIVER AND TRANSCEIVER FOR MULTI-LEVEL CURRENT-MODE SIGNALING

(75) Inventors: Il-Kwon Chang, Gimpo-si (KR); Yong-Weon Jeon, Suwon-si (KR); Kyung-Wol Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 96 days.

(21) Appl. No.: 11/302,438

(22) Filed: Dec. 14, 2005

(65) Prior Publication Data

US 2006/0199556 A1 Sep. 7, 2006

(30) Foreign Application Priority Data

Dec. 15, 2004 (KR) ............ 10-2004-0106035

(51) Int. Cl.
*H03R 19/0175* (2006.01)
(52) U.S. Cl. .............................. 326/82; 326/83; 326/86
(58) Field of Classification Search ............ 326/82–83, 326/86, 90, 115, 126–127
See application file for complete search history.

(56) References Cited

U.S. PATENT DOCUMENTS

| 5,568,064 A | 10/1996 | Beers et al. |
| 2005/0047511 A1* | 3/2005 | Dosho et al. ............... 375/257 |

FOREIGN PATENT DOCUMENTS

| KR | 1999-82865 | 11/1999 |
| KR | 2000-0020724 | 4/2000 |
| KR | 10-2004-0059234 | 7/2004 |

* cited by examiner

*Primary Examiner*—Anh Q. Tran
(74) *Attorney, Agent, or Firm*—Harness, Dickey & Pierce, P.L.C.

(57) ABSTRACT

Provided are a receiver and a transceiver for multi-level current-mode signaling, which together may reduce the number of bus lines and increase a data bandwidth. A transmitter transmits one reference current and a multi-level data current. On the basis of the reference current signal received from the transmitter, a receiver generates plural internal reference currents for determining the multi-level data current received from the transmitter, and converting the received multi-level data current into a data voltage having the desired level corresponding to the data that was transmitted.

25 Claims, 5 Drawing Sheets

RECEIVER AND TRANSCEIVER FOR MULTI-LEVEL CURRENT-MODE SIGNALING

PRIORITY STATEMENT

This application relies for priority upon Korean Patent Application No. 2004-106035 filed on Dec. 15, 2004, the contents of which are herein incorporated by reference their entirety.

BACKGROUND OF THE INVENTION

Generally, for data transmission of a transceiver, a data transmitting method using a multi-level voltage signal (i.e., a multi-bit coded signal) has been used to increase a data transmission bandwidth on one bus line. However, in this multi-level voltage-mode signaling method, one signal level contains multi-bit data, and discrimination of the multi-bit data is determined by different signal levels. Therefore, when compared to a method of transmitting one-bit data, the multi-level voltage-mode signaling method requires finer discrimination of signal levels.

However, when signals requiring the finer signal level discrimination are transmitted through a transmission line having resistance and capacitance, efficiency and reliability in signal transmission may be degraded due to problems caused by, e.g., a resistor-capacitor (RC)-loading effect (such as a signal distortion and a reduced operating speed), etc. Additionally, when reference voltage signals for discriminating signal levels are transmitted from a transmitter, the number of signal lines for the reference voltage signals undesirably increases according to the number of the signal levels.

SUMMARY OF THE INVENTION

Accordingly, at least one embodiment of the present invention can substantially obviate one or more problems due to limitations and disadvantages of the related art.

At least some example embodiments of the present invention respectively provide a receiver and a transceiver for multi-level current-mode signaling, which may achieve at least one of the following, reduce the number of bus lines, increase a data bandwidth, and efficiently process received data.

At least one example embodiment of the present invention provides a receiver for multi-level current-mode signaling. Such a receiver may include: a reference current generator to generate a plurality of internal reference currents in response to an external reference current; a reference current selector to select one of the plurality of internal reference currents in response to a switch control signal; and a current-to-voltage converter to convert an N-bit input data current into N-bit data voltage based on a difference current between an output current of the reference current selector and a current corresponding to the N-bit input data current, N being a natural number, the current-to-voltage converter further being iteratively operable N-times upon N different ones of the plurality of internal reference currents of the internal reference currents to generate the N-bit data voltage.

At least one other example embodiment of the present invention provides a receiver for multi-level current-mode signaling. Such a receiver may include: a reference current generator to generate a plurality of internal reference currents in response to an external reference current; a reference current selector to select one of the plurality of internal reference currents in response to a switch control signal; a current-to-voltage conversion amplifier to convert a difference current, between an output current of the reference current selector and a current corresponding to an input data current, into a changed signal; and a data voltage generator to perform a logic-process on the changed signal that is to be converted into corresponding data voltage.

At least one other example embodiment of the present invention provides a transceiver for multi-level current-mode signaling. Such a transceiver may include: a first voltage-to-current conversion amplifier to convert a reference voltage into a first conversion current and to provide the first conversion current as an external reference current through a first channel; a second voltage-to-current conversion amplifier to convert a transmission data voltage into a second conversion current and to provide the second conversion current as an input data current through a second channel; a reference current generator to generate a plurality of internal reference currents in response to the external reference current; a reference current selector to select one of the plurality of internal reference currents in response to a switch control signal; a current-to-voltage conversion amplifier to convert a difference current, between an output current of the reference current selector and a current corresponding to an input data current, into a changed signal; and a data voltage generator to perform a logic-process on the changed signal and so cause the input data current to be converted into corresponding voltage.

Additional features and advantages of the present invention will be more fully apparent from the following detailed description of example embodiments, the accompanying drawings and the associated claims.

BRIEF DESCRIPTION OF THE DRAWINGS

The above and other advantages of the present invention will become more apparent by describing in detail example embodiments thereof with reference to the accompanying drawings, in which.

The accompanying drawings are intended to depict example embodiments of the present invention and should not be interpreted to limit the scope thereof. The accompanying drawings are not to be considered as drawn to scale unless explicitly noted.

DESCRIPTION OF THE EXAMPLE EMBODIMENTS

Hereinafter, example embodiments of the present invention will be described in detail with reference to the accompanying drawings.

It will be understood that, although the terms first, second, etc. may be used herein to describe various elements, these elements should not be limited by these terms. These terms are only used as labels to provide a shorthand way of distinguishing one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
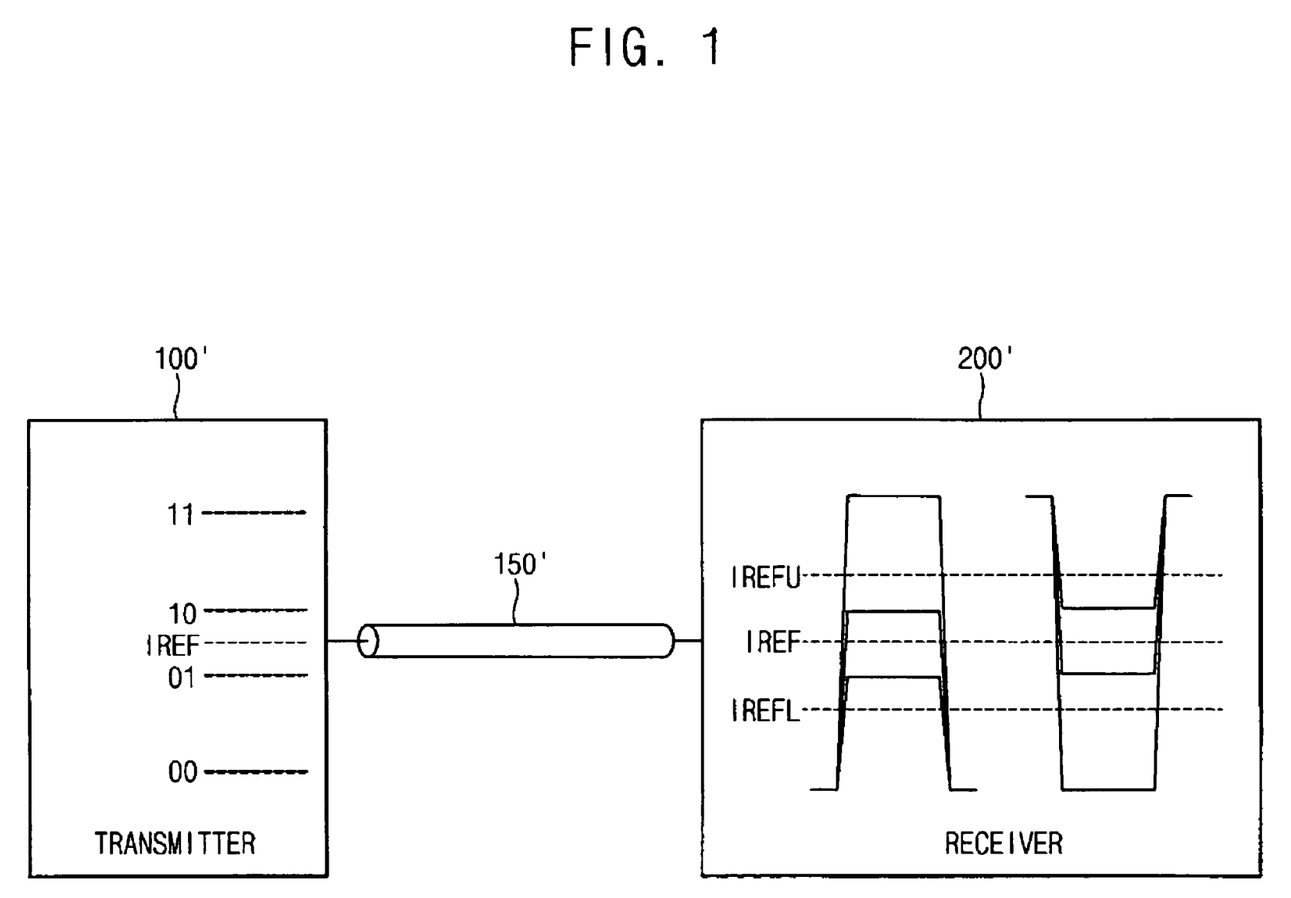
FIG. 1 is a conceptual diagram illustrating a multi-level current-mode signaling method using, e.g., four, current signals according to an example embodiment of the present invention.
Figure 2:
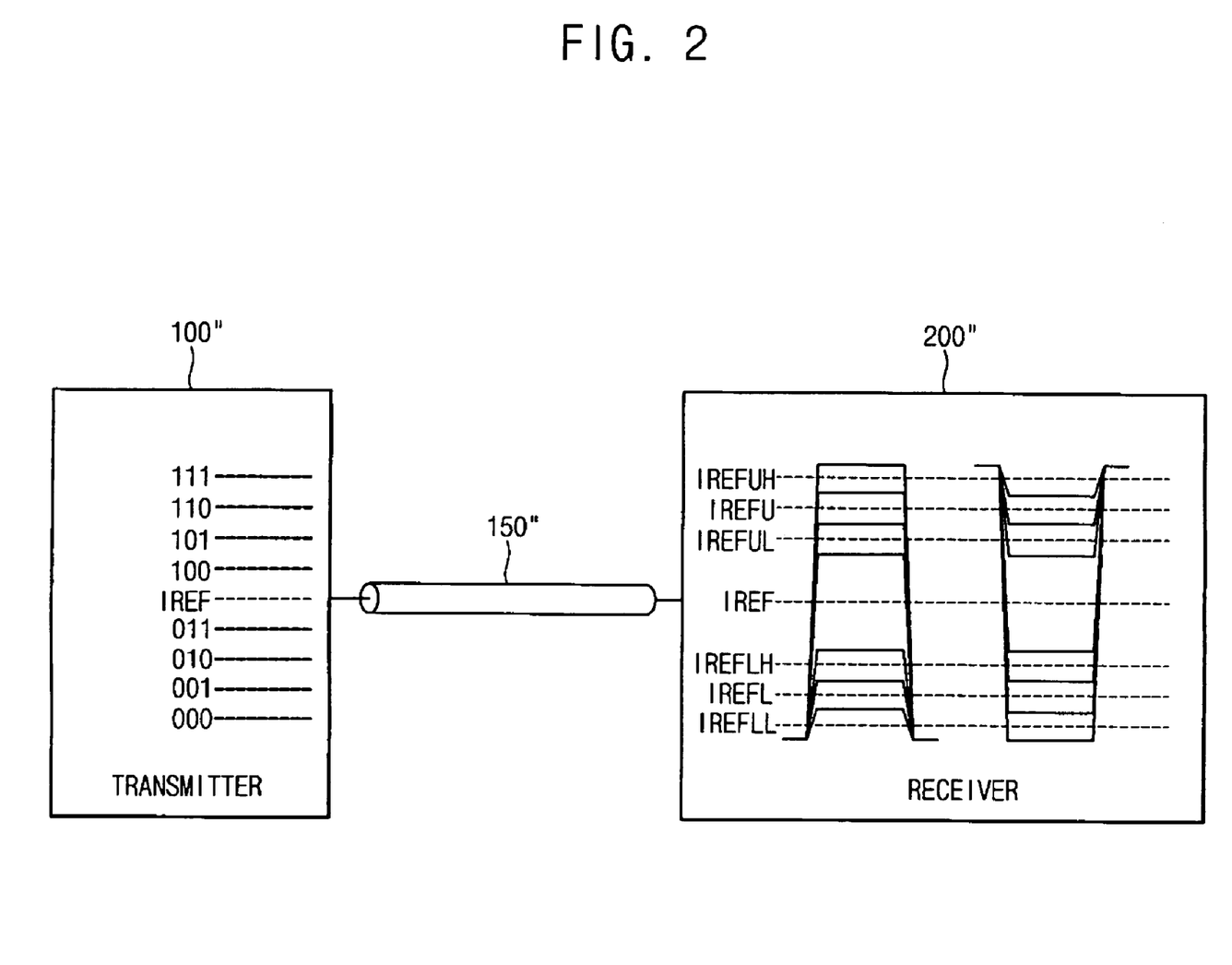
FIG. 2 is a conceptual diagram illustrating a multi-level current-mode signaling method using, e.g., eight, current signals according to another example embodiment of the present invention.

FIG. 1 is a conceptual diagram illustrating a multi-level current-mode signaling method using, e.g., four, current signals according to an example embodiment of the present invention, and FIG. 2 is a conceptual diagram illustrating a multi-level current-mode signaling method using, e.g., eight, current signals according to another example embodiment of the present invention.

In FIG. 1, a transmitter 100' can represent a current level or amplitude as one among into a set of. e.g., four, discrete values and can transmit a signal over a channel 150 to a receiver 200' by using one of the four current values. That is, one current value corresponds to one of four different 2-bit data patterns, namely 11, 10, 01 and 00, and the receiver 200 can have three reference current levels IREFU, IREF and IREFL for discriminating the four current signals. Accordingly, it is possible to transmit multi-bit data by using one current level.

In FIG. 2, a transmitter 100" can represent a current level as one among a set of, e.g., eight, values, and can transmit a signal to a receiver 200 by using one of the eight current values. That is, one current value corresponds to one of eight 3-bit data patterns, namely 111, 110, 101, 100, 011, 010, 001 and 000, and the receiver 200 can have seven reference current levels IREFUH, IREFU, IREFUL, IREF, IREFLH, IREFL, and IREFLL for discriminating the eight current signals. Accordingly, it is possible to transmit multi-bit data by using one current level.

Figure 3:
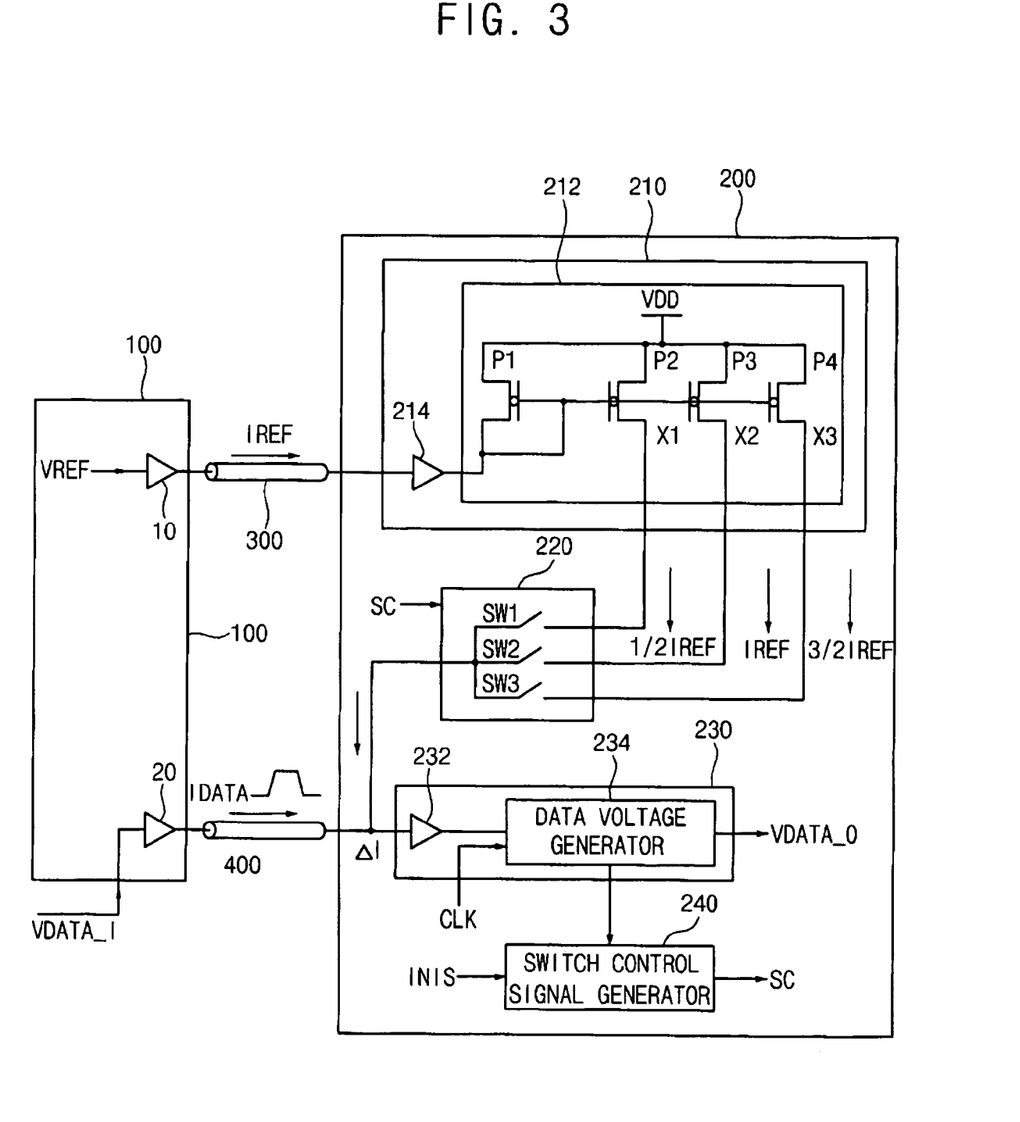
FIG. 3 is a block diagram of a transceiver according to an example embodiment of the present invention.

FIG. 3 is a block diagram of a transceiver according to an example embodiment of the present invention. The channels 300 and 400 can be, e.g., transmission lines that exhibit non-idealized resistances and/or capacitances, respectively.

Referring to FIG. 3, the transceiver can include a transmitter 100, a first transmission line 300, a second transmission line 400, and a receiver 200.

The transmitter 100 can include a first voltage-to-current conversion amplifier 10 and a second voltage-to-current conversion amplifier 20. The first voltage-to-current conversion amplifier 10 can convert a reference voltage VREF into a reference current IREF, and can provide the reference current IREF to the receiver 200 via the first channel 300. The second voltage-to-current conversion amplifier 20 can convert an input data voltage VDATA_I into a data current IDATA, and can provide the data current IDATA to the receiver 200 via the second channel 400.

The receiver 200 can include a reference current generator 210, a reference current selector 220, a current-to-voltage converter 230, and a switch control signal generator 240.

The reference current generator 210 can include a reference current buffer 214 and a current generator 212, e.g., of a current-mirror type. The reference current buffer 214 can buffer the reference current IREF received from the transmitter 100. The current generator 212 of a current-mirror type can include a current mirror transistor (e.g., PMOS) P1 and transistors (e.g., PMOS) P2, P3 and P4 for mirroring a current of the current mirror transistor P1, and thus can generate a plurality of internal reference currents from the transistors P2, P3 and P4. For example, when the size of the mirror transistor P1 is X2 and a reference current IREF flows therethrough, the transistors P2, P3 and P4 whose sizes are respectively X1, X2 and X3 generate internal reference currents ½×IREF, IREF, and 3/2×IREF, respectively.

In this manner, the transmitter 100 needs to transmit only one reference current IREF to the receiver 200, and the receiver 200 can generate an appropriate number of internal reference currents for determining a logic value of a multi-level data current IDATA received from the transmitter 100. Accordingly, the number of bus lines for transmitting the reference current may be reduced.

The reference current selector 220 can include a plurality of switches SW1, SW2 and SW3 for selecting, e.g., sequentially, among the internal reference currents generated by the reference current generator 210, e.g. according to a switch control signal SC (to be discussed in more detail below).

The current-to-voltage converter 230 can include a current-to-voltage conversion amplifier 232 and a data voltage generator 234. The current-to-voltage conversion amplifier 232 can convert a difference current ΔI, between an internal reference current selected by the reference current selector 220 and a data current IDATA received from the transmitter 100, into an analog voltage signal. The data voltage generator 234 can generate a data voltage VDATA_0 corresponding to the received data current IDATA by logic-processing the analog voltage signal received from the current-to-voltage conversion amplifier 232. The current-to-voltage conversion amplifier 232 continuously can respond to variation of a signal which is input to the current-to-voltage conversion amplifier 232. Therefore, the data voltage generator 234 can wait until an analog signal reflecting that ΔI equalizes zero (or approximately zero) is developed at the current-to-voltage conversion amplifier 232, and can adjust the voltage VDATA_0 based on a clock signal CLK.

Also, the current-to-voltage converter 230 can perform a repetitive operation for generating N-bit data voltage corresponding to a data current having N-bit data (where N is a natural number). This repetitive operation will now be described in detail.

For example, a data current IDATA having a current level corresponding to a 2-bit pattern data "10" of data is transmitted from the transmitter 100 to the receiver 200. In this case, switch control signal SC causes the switch SW2 of the reference current selector 220 to be closed so as to provide a current having at least substantially the same amplitude as the reference current IREF from the transistor P3 to the current-to-voltage converter 230. As illustrated in FIG. 1, a data current whose level (or amplitude) corresponds to the 2-bit pattern of data "10" has a higher current value than the reference current level IREF. Accordingly, the current-to-voltage converter 230 first generates and outputs a data voltage corresponding to, e.g., a logical "1". Next, in order to re-compare the received data current IDATA with an internal reference current having a relatively-higher current value, the switch SW3 is caused to be closed by the switch control signal SC to provide the reference current ³⁄₂×IREF (corresponding to the reference current level IREFU in FIG. 1) from the transistor P4 to the current-to-voltage converter 230. At this point in the example, the received data current IDATA has a lower current value than the reference current level ³⁄₂×IREFU. Accordingly, the current-to-voltage 230 generates a data voltage corresponding to "0". As described above, the current-to-voltage converter 230 performs the repetitive operation two times so as to convert the 2-bit data current into a 2-bit data voltage "10". On the contrary (albeit in the context of this example), when the received data current IDATA is "01", the switch SW2 and the switch SW1 are sequentially controlled to close in order to perform the comparison operations.

Continuing the example as it pertains to when the received data current IDATA is "01," the switch control signal generator 240 can generate a switch control signal SC for sequentially controlling the switches SW1, SW2 and SW3 so as to provide appropriate sequence of internal reference currents for the repetitive operation of the current-to-voltage converter 230. During the first repetitive operation of the current-to-voltage converter 230, the internal reference current having the at least substantially same value as the reference current IREF from the transmitter 100 is first provided to the current-to-voltage converter 230, and thus the switch SW2 is at first controlled to be closed according to the switch control signal SC. The switch control signal SC itself may be configured to cause the selection of the switch SW2 according to an initial select signal INIS indicating that a valid data current has started to be transmitted. The subsequent switch control is performed according to a sequential decoding scheme based upon a state of the data voltage generator 234. That is, the opened or closed states of the remaining switches SW1 and SW3 are determined according to the results of the current comparison operation. This sequential decoding scheme is well known to those skilled in the art and thus a detailed description thereof will be omitted in the interests of being concise. Also, the sequential decoding scheme may be applied in various forms without departing from the concept of the present invention.

Figure 4:
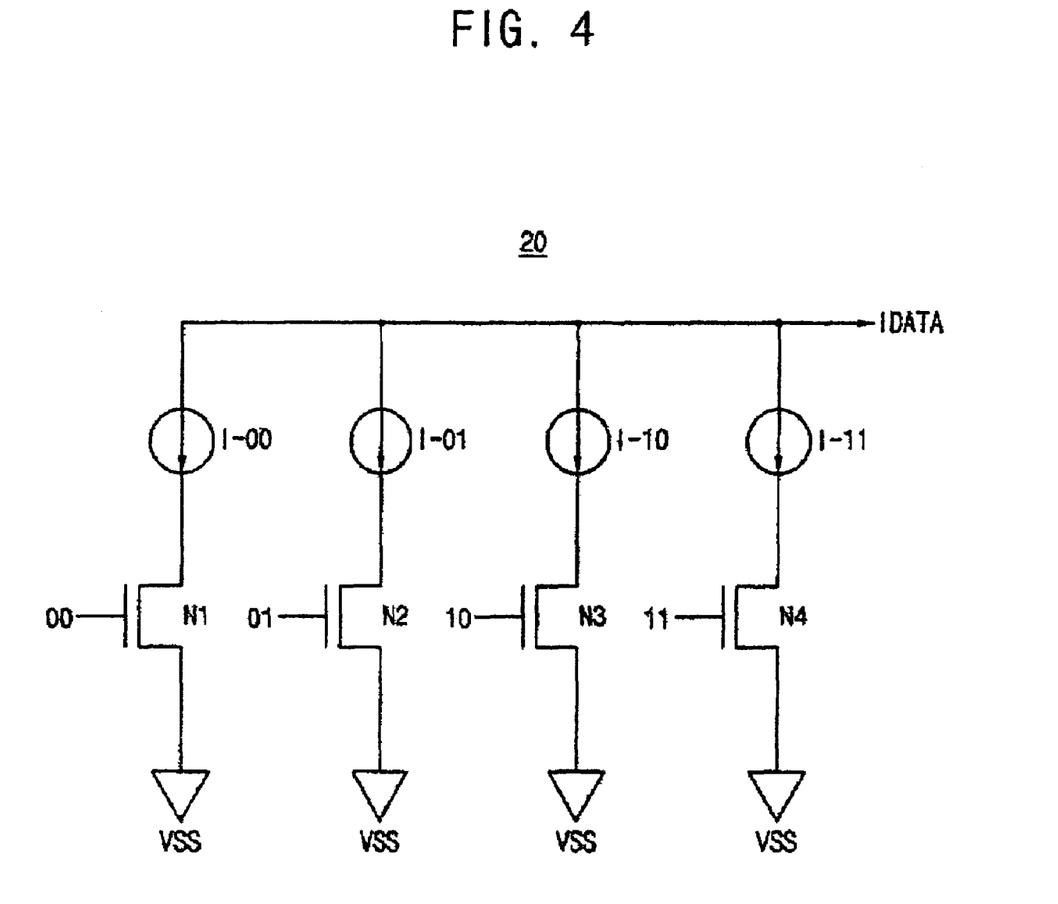
FIG. 4 is a circuit diagram of a voltage-to-current conversion amplifier of a transmitter for data transmission according to an example embodiment of the present invention.

FIG. 4 is a circuit diagram of a voltage-to-current conversion amplifier 20 of a transmitter for data transmission according to an example embodiment of the present invention.

Referring to FIG. 4, in order to convert data voltage into a multi-level current signal (data) having multi-bit data, the second voltage-to-current conversion amplifier 20 of the transmitter 100 can include transistor (e.g., NMOS) switches N1, N2, N3 and N4, and current sources I-00, I-01, I-10 and I-11 having four different current values for transmission of a 2-bit data. An intended 2-bit data voltage is decoded to turn on one of the transistor switches N1, N2, N3 and N4. The turn-on of a corresponding transistor switch activates a corresponding current source, thereby generating a data current having a current value corresponding to the intended 2-bit data voltage.

Figure 5:
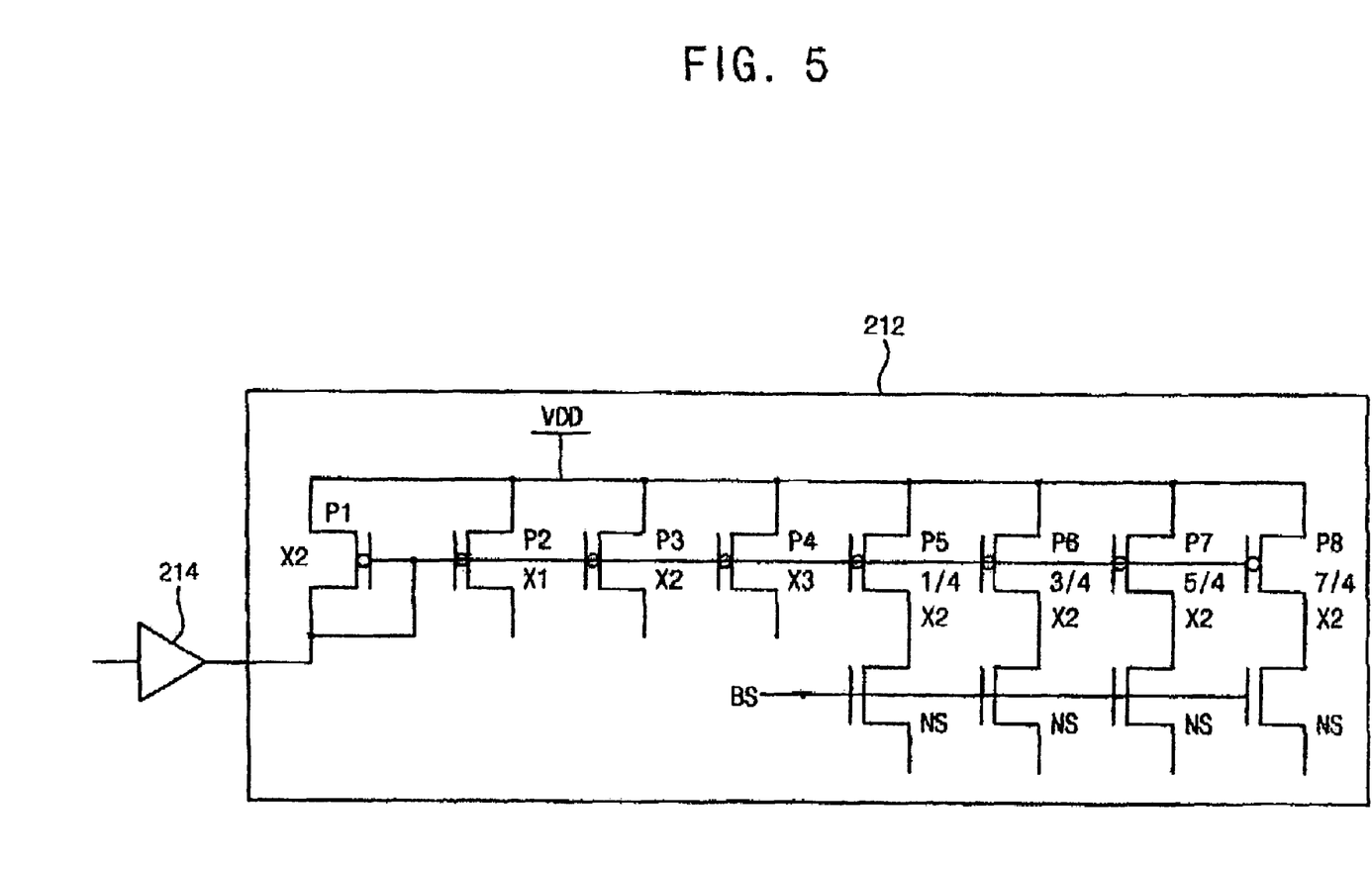
FIG. 5 is a circuit diagram of a reference current generator according to another example embodiment of the present invention.

FIG. 5 is a circuit diagram of a reference current generator 212 according to another example embodiment of the present invention.

Referring to FIG. 5, the reference current generator 212 can include transistors (e.g., PMOS) P2, P3 and P4 for providing internal reference currents in a 2-bit data current transmission mode, transistors (e.g., PMOS) P5, P6, P7 and P8 for providing additional internal reference currents in a 3-bit data current transmission mode, and switches NS for controlling the outputs of the transistors P5, P6, P7 and P8. In order to select the number of transmission bits of an intended data current (for example, to select among the 2-bit or 3-bit illustrated in FIG. 1 and FIG. 2, respectively), the number of the internal reference currents provided to the reference current selector 220 may be selectively determined by a bit number select signal BS according to the operating modes. In the example of FIG. 5, the number of the switches of the reference current selector 220 correspondingly is 7, and the switch control signal generator 240 appropriately can control the switches of the reference current selector 220 according to the selected one of the operating modes (for example, 2-bit and 3-bit data current transmission modes).

As described above, a transceiver according to one or more of the example embodiments of the present invention can transmit the multi-level current-mode signal having the multi-bit data together with one reference current signal, thereby making it possible to reduce the number of the bus lines and to increase the data bandwidth. Also, a transceiver according to one or more of the example embodiments of the present invention can perform the repetitive operation for determining the received data current, thereby making it possible to efficiently process the received data.

While the present invention has been described with reference to the example embodiments, it will be apparent to those skilled in the art that various changes and modifications may be made without departing from the spirit and scope of the invention.

What is claimed is:

1. A receiver for a multi-level current-mode signaling, the receiver comprising:
   a reference current generator to generate a plurality of internal reference currents in response to an external reference current;
   a reference current selector to select one of the plurality of internal reference currents in response to a switch control signal; and
   a current-to-voltage converter to convert an N-bit input data current into N-bit data voltage based on a difference current between an output current of the reference current selector and a current corresponding to the N-bit input data current, N being a natural number, the current-to-voltage converter further being iteratively operable N times upon N different ones of the plurality of internal reference currents to generate the N-bit data voltage.

2. The receiver of claim 1, wherein the external reference current is received from a transmitter through a channel, and the external reference current includes only one reference current.

3. The receiver of claim 1, wherein the current-to-voltage converter comprises:
a current-to-voltage conversion amplifier to convert the difference current into a voltage; and
a data voltage generator to perform a logic-process on an output signal of the current-to-voltage conversion amplifier and so produce the N-bit data voltage corresponding to the N-bit input data current.

4. The receiver of claim 3, further comprising a switch control signal generator to generate the switch control signal based on a state of the data voltage generator.

5. The receiver of claim 4, wherein:
the reference current selector includes a plurality of switches to select from among the plurality internal reference currents according to the switch control signal; and
the switch control signal generator further is operable to generate the switch control signal for selecting one of the plurality of switches so as to provide to the current-to-voltage conversion amplifier the internal reference current having at least substantially the same level as that of the external reference current for a first operation among N operations of the current-to-voltage converter.

6. The receiver of claim 3, wherein the data voltage generator generates the N-bit data voltage in response to a clock signal.

7. The receiver of claim 1, wherein the reference current generator comprises:
a reference current buffer to buffer the external reference current; and
a current generator of a current-mirror type, coupled to the output of the reference current buffer, to generate the internal reference currents.

8. The receiver of claim 1, wherein the reference current generator further is operable to control the internal reference currents provided to the reference current selector based on one of the following,
the number of transmission bits of the N-bit input data current, and
in response to a bit number select signal for selecting the number of the transmission bits.

9. A receiver for multi-level current-mode signaling, the receiver comprising:
a reference current generator to generate a plurality of internal reference currents in response to an external reference current;
a reference current selector to select one of the plurality of internal reference currents in response to a switch control signal;
a current-to-voltage conversion amplifier to convert a difference current, between an output current of the reference current selector and a current corresponding to an input data current, into a changed signal; and
a data voltage generator to perform a logic-process on the changed signal and so cause the input data current to be converted into corresponding data voltage.

10. The receiver of claim 9, wherein the external reference current is received from a transmitter through a channel, and the external reference current includes only one reference current.

11. The receiver of claim 9, further comprising a switch control signal generator to generate the switch control signal based on a state of the data voltage generator so as to sequentially provide the internal reference currents in a sequence suitable for determining a logic value corresponding to the input data current.

12. The receiver of claim 11, wherein:
the reference current selector includes a plurality of switches to select from among the plurality internal reference currents according to the switch control signal; and
the switch control signal generator further is operable to generate the switch control signal for selecting one of the plurality of switches so as to provide to the current-to-voltage conversion amplifier the internal reference current having at least substantially the same level as that of the external reference current for a first operation among a plurality of operations of the current-to-voltage conversion amplifier.

13. The receiver of claim 9, wherein the data voltage generator generates the data voltage in response to a clock signal.

14. The receiver of claim 9, wherein the reference current generator comprises:
a reference current buffer to buffer the external reference current; and
a current generator of a current-mirror type, coupled to the output of the reference current buffer, to generate the internal reference currents.

15. The receiver of claim 9, wherein the reference current generator further is operable to control the internal reference currents provided to the reference current selector based on one of the following,
the number of transmission bits of the input data current, and
a bit number select signal for selecting the number of the transmission bits.

16. A transceiver for multi-level current-mode signaling, the receiver comprising:
a first voltage-to-current conversion amplifier to convert a reference voltage into a first conversion current and to provide the first conversion current as an external reference current through a first channel;
a second voltage-to-current conversion amplifier to convert a transmission data voltage into a second conversion current and to provide the second conversion current as an input data current through a second channel;
a reference current generator to generate a plurality of internal reference currents in response to the external reference current;
a reference current selector to select one of the plurality of the internal reference currents in response to a switch control signal;
a current-to-voltage conversion amplifier to convert a difference current, between an output current of the reference current selector and a current corresponding to an input data current, into a charged signal; and
a data voltage generator to perform a logic-process on the charged signal and so cause the input data current to be converted into corresponding data voltage.

17. The transceiver of claim 16, wherein the external reference current includes only one reference current.

18. The transceiver of claim 16, further comprising a switch control signal generator to generate the switch control signal based on a state of the data voltage generator so as to sequentially provide the internal reference currents in a sequence suitable for determining a logic value corresponding to the input data current.

19. The transceiver of claim 18, wherein:
the reference current selector includes a plurality of switches to select from among the plurality internal reference currents according to the switch control signal; and
the switch control signal generator further is operable to generate the switch control signal for selecting one of the plurality of switches so as to provide to the current-to-voltage conversion amplifier an internal reference current having at least substantially the same level as that of the external reference current for a first operation among a plurality of operations of the current-to-voltage conversion amplifier.

20. The transceiver of claim 16, wherein the reference current generator comprises:
a reference current buffer to buffer the external reference current; and
a current generator of a current-mirror type, coupled to the output of the reference current buffer, to generate the internal reference currents.

21. The transceiver of claim 16, wherein the reference current generator further is operable to control the internal reference currents provided to the reference current selector based on one of the following,
the number of transmission bits of the input data current, and
a bit number select signal for selecting the number of the transmission bits.

22. A method of receiving a multi-level signal, the method comprising:
receiving a data current that, before a transmission thereof, has an amplitude corresponding to one among a set of discrete amplitudes;
generating a plurality of reference currents corresponding to the set of discrete amplitudes; and
determining which of the reference currents best matches the received data current.

23. The method of claim 22, further comprising:
receiving a reference current from the same source from which the data current is received;
wherein the step of generating is based upon the received reference current.

24. The method of claim 22, further comprising:
converting the best matching reference current among the reference currents into a data voltage corresponding to the best matching reference current.

25. The method of claim 22, wherein the step of determining includes:
sequentially obtaining a difference current between the received data current and the plurality of reference currents, respectively, to identify which among the plurality of reference currents yields a substantially zero difference current.

* * * * *